Jan. 21, 1964 J. G. DILL 3,119,075

BANDPASS AMPLIFIER CIRCUITS UTILIZING AN INDUCTIVE TRANSISTOR

Filed April 3, 1961 5 Sheets-Sheet 1

INVENTOR.
JOHANN G. DILL,
BY
Walter J. Adam
ATTORNEY.

BANDPASS AMPLIFIER CIRCUITS UTILIZING AN INDUCTIVE TRANSISTOR

Filed April 3, 1961 5 Sheets-Sheet 2

INVENTOR.
JOHANN G. DILL,
BY
Walter J. Adam
ATTORNEY.

BANDPASS AMPLIFIER CIRCUITS UTILIZING AN INDUCTIVE TRANSISTOR

Filed April 3, 1961 5 Sheets-Sheet 3

INVENTOR.
JOHANN G. DILL,
BY
Walter J. Adam
ATTORNEY

INVENTOR.
JOHANN G. DILL,
BY
Walter J. Adam
ATTORNEY.

INVENTOR.
JOHANN G. DILL,
BY
Walter J. Adam
ATTORNEY.

United States Patent Office 3,119,075

Patented Jan. 21, 1964

3,119,075

BANDPASS AMPLIFIER CIRCUITS UTILIZING AN INDUCTIVE TRANSISTOR

Johann G. Dill, Costa Mesa, Calif., assignor to Hughes Aircraft Company, Culver City, Calif., a corporation of Delaware Filed Apr. 3, 1961, Ser. No. 100,070

5 Claims. (Cl. 330—31)

This invention relates to bandpass amplifier circuits and particularly to a simplified and improved negative resistance amplifier utilizing semiconductor elements.

Conventional arrangements for providing bandpass amplification generally have the disadvantages of being complex and bulky and of developing excessive losses. Amplifiers including resonant circuits that utilize coil type inductive components are especially undesirable for micro-miniaturized circuitry because of the bulk and weight of the inductive components. Inductive diodes which may be included in a resonant circuit may be undesirable because of the small Q factor developed thereby and because of being relatively unstable. A bandpass amplifier circuit that is highly stable and that includes a semiconductor element for providing the inductive reactance would be of advantage to the art. Also, a bandpass amplifier circuit that provides unidirectional power gain with a minimum number of components would be highly useful.

It is therefore an obect of this invention to provide a simplified small-signal bandpass amplifier having unidirectional power gain.

It is a further object of this invention to provide a parallel resonant circuit utilizing inductive semiconductor elements for developing amplification with a relatively large power gain.

It is a still further object of this invention to provide a negative resistance amplifier utilizing an improved transistor device that develops both the inductance and the required negative resistance properties.

It is another object of this invention to provide a micro-miniaturized bandpass amplifier.

It is another object of this invention to provide a bandpass amplifier circuit that is temperature stable and has a stable D.C. operating point.

Briefly, in accordance with this invention, a negative resistance amplifier of the parallel resonant circuit class is provided that utilizes an inductive transistor operating as a two terminal inductive element. The inductive transistor has a large base resistance for developing a relatively large inductance, a base cut-off frequency substantially smaller than the selected frequency of operation, a relatively large grounded base current amplification factor and characteristics for developing negative resistance properties. The amplifier circuit includes the inductive transistor arranged in a grounded base configuration and properly biased to develop the negative resistance properties as well as the relatively large inductance. A capacitive element is coupled between the emitter and base electrodes of the transistor to develop a desired passband. The simplified resonant circuit thus provides power gain in response to signals applied to the emitter electrode. Other circuits in accordance with this invention have additional isolation means between the input and the output terminals. Further arrangements in accordance with the invention provide micro-miniaturized semiconductor arrangements of the bandpass amplifier circuits.

The novel features of this invention, as well as the invention itself, both as to its organization and method of operation, will best be understood from the accompanying description taken in connection with the accompanying drawings in which like characters refer to like parts, and in which.

Figure 1:
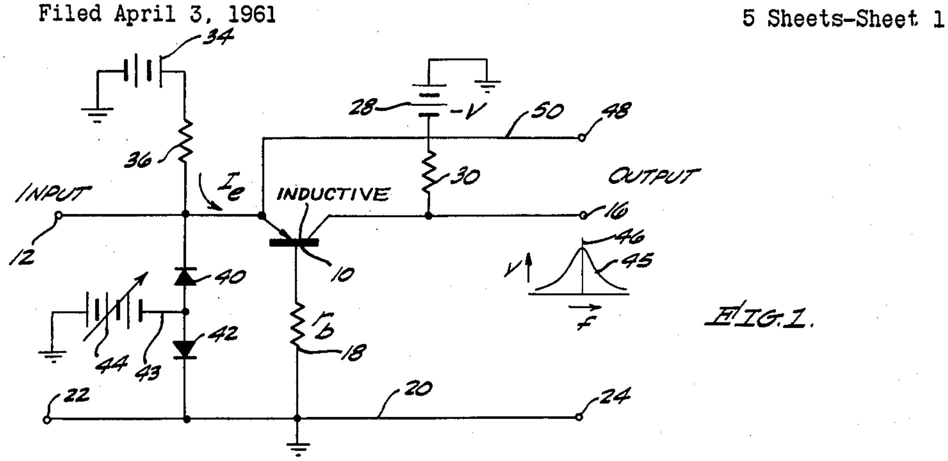
FIG. 1 is a schematic circuit diagram of one arrangement of the bandpass amplifier circuit in accordance with this invention.

Referring to the bandpass amplifier circuit of FIG. 1, a transistor 10 which may be of the p-n-p type is arranged in a grounded base configuration with an emitter coupled to a first input terminal 12 and a collector coupled to a first output terminal 16. The base of the transistor 10 is coupled through a resistor 18 to a lead 20 which in turn is coupled to an input terminal 22 and to an output terminal 24. As will be explained subsequently, the base resistance having a value $r_b$ may be developed by the external resistor 18 or may be developed by internal resistance $r_b'$ of the transistor 10. For biasing the transistor 10 to develop an avalanche multiplication or negative resistance characteristic, a source of potential such as a battery 28 has a positive terminal coupled to ground and a negative terminal coupled through a resistor 30 to the collector of the transistor 10. In order to provide an A.C. (alternating current) short to ground as required for the improved inductive reactance in accordance with this invention, the resistor 30 must have a relatively small value. However, other arrangements for providing an A.C. short to ground may include a capacitor (not shown) coupled between the collector of the transistor 10 and the ground lead 20. Also, to provide a desired emitter resistance characteristic of the transistor 10, a source of potential such as a battery 34 has a negative terminal coupled to ground and a positive terminal coupled through a resistor 36 to the emitter of the transistor 10 to provide an effective source of emitter current thereto. The capacitance of the resonant circuit is provided by capacitive diodes 40 and 42 having respective cathode to anode and anode to cathode paths coupled in series between the emitter of the transistor 10 and the lead 20. A source of potential such as a variable battery 44 has a positive terminal coupled to ground and a negative terminal coupled through a lead 43 to the anodes of the diodes 40 and 42 to provide selective tuning of the bandpass amplifier circuit. Thus, a desired passband shown by a curve 45 and having a selected center frequency or resonant frequency 46 is developed by the circuit. Another output terminal 48 is coupled through a lead 50 to the emitter of the transistor 10 to provide amplification but with bi-directional power gain as will be discussed subsequently.

Figures 2, 3:
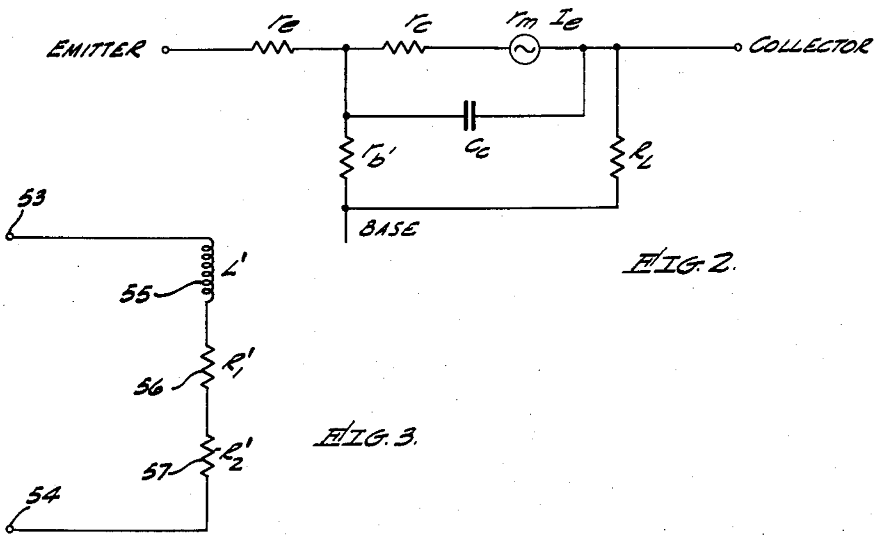
FIG. 2 is a schematic equivalent circuit diagram for explaining the characteristics of the inductive transistor device utilized in the circuits and arrangements of this invention.
FIG. 3 is a schematic circuit diagram for further explaining the characteristics of the inductive transistor utilized in the circuits and arrangements of this invention.

Before further explaining the bandpass amplifier circuit in accordance with this invention, the characteristics of the inductive transistor 10 will be further explained. The input impedance $Z_e$ as a first approximation neglecting collector capacitance may be expressed as:

$$Z_e = r_e + r_b \frac{r_c - r_m + R_L}{r_b + r_c + R_L} \quad (1)$$

where, as shown in FIG. 2, $r_e$ is the emitter resistance, $r_b$ is the intrinsic base resistance $r_b'$ as well as external resistance of the resistor 18 of FIG. 1 and $r_c$ is the collector series resistance. Also, $r_m$ is a resistance equal to $r_c\alpha$ where $\alpha$ is the current amplification factor of the transistor 10, and $R_L$ is the collector load resistor shown by the resistor 30 of FIG. 1. Thus, when the collector load resistance $R_L$ and the overall base resistance $r_b$ are both substantially smaller than the collector series resistance $r_c$, the input impedance $Z_e$ may be expressed as:

$$Z_e = r_e + r_b[1-\alpha] \quad (2)$$

The current amplification factor $\alpha$ may be expressed as:

$$\alpha = \frac{1}{1+\left(\frac{f}{f_b}\right)^2}\alpha_0 \quad (3)$$

where $f$ is the operating frequency of the transistor, $f_b$ is the base diffusion cut-off frequency which for a diffusion transistor may be expressed as:

$$f_b = \frac{1.22D}{\pi W^2} \quad (4)$$

where D is the diffusion coefficient and has a value of approximately 100 cm.$^2$/sec. for a germanium p-n-p type transistor. Also, W is the effective base width and $\alpha_0$ is the grounded base current amplification factor at very low frequency.

One requirement of the inductive transistor is that the effective base width W of Equation 4 be sufficiently large to develop the required phase shift of the signal applied thereacross. Thus, the base cut-off frequency $f_b$ is sufficiently small relative to the operating frequency $f$ so that $\alpha$ has a complex characteristic to develop a large inductive reactance. It is to be noted that the effective base width W is limited to a maximum value because recombination of minority carriers increases with an excessively wide base region.

From the simplified assumption, the input impedance $Z_e$ may be expressed as:

$$Z_e = r_e + r_b - r_b\frac{\alpha_0}{1+\left(\frac{f}{f_b}\right)^2} + jr_b\frac{\alpha_0\frac{f}{f_b}}{1+\left(\frac{f}{f_b}\right)^2} \quad (5)$$

where $$r_e + r_b - r_b\frac{\alpha_0}{1+\left(\frac{f}{f_b}\right)^2}$$

is the resistive or real part of the input impedance and $$+jr_b\frac{\alpha_0\frac{f}{f_b}}{1+\left(\frac{f}{f_b}\right)^2}$$

is the inductive reactance or imaginary part of the input impedance. It is to be noted at this time that the base resistance $r_b$ must have a large value in order to develop a large inductive reactance. Thus, the input impedance $Z_e$ includes the resistance or real component $R_1'$ and the inductance component L' of FIG. 3 at a selected frequency $f$.

Another requirement of the transistor device in accordance with this invention is that the $\alpha_0$ factor be substantially equal to unity to develop a relatively large inductive reactance. Also, as shown in Equation 5 a large $\alpha_0$ increases the term $$-r_b\frac{\alpha_0}{1+\left(\frac{f}{f_b}\right)^2}$$

so that the resistance component $R_1'$ of FIG. 3 of the input impedance $Z_e$ is a minimum. Also, to minimize the resistance $R_1'$ the emitter resistance $r_e$ must have a minimum value. The resistance $r_e$ may be expressed as $$r_e = \frac{KT}{qI_e} \quad (6)$$

where

K is Boltzmann's constant,
$q$ is the charge in coulombs of an electron,
$T$ is temperature in degrees Kelvin, and
$I_e$ is the emitter current of FIG. 1.

Thus, to provide a relatively small emitter resistance $r_e$, the emitter current $I_e$ of FIG. 1 is selected to be relatively large.

The Q of the inductive transistor using the first approximation for $Z_e$ may be expressed as:

$$Q = \frac{fL}{2\pi R_1} \simeq \frac{\dfrac{r_b\alpha_0\frac{f}{f_b}}{1+\left(\frac{f}{f_b}\right)^2}}{r_e + r_b - \dfrac{r_b\alpha_0}{1+\left(\frac{f}{f_b}\right)^2}} \quad (7)$$

Thus, a large value of the resistance $r_e$ and a low value of $\alpha_0$ limits the value of Q in Equation 7.

A more detailed solution for the input impedance $Z_e$ by using a better approximation of frequency dependence of $\alpha$ is:

$$\alpha = \frac{e^{\left[-jm\frac{f}{f_b}\right]}}{1+j\frac{f}{f_b}}$$

$$= \alpha_0\left[\frac{\cos m\frac{f}{f_b} - \frac{f}{f_b}\sin m\frac{f}{f_b}}{1+\left(\frac{f}{f_b}\right)^2} - j\frac{\frac{f}{f_b}\cos m\frac{f}{f_b} + \sin m\frac{f}{f_b}}{1+\left(\frac{f}{f_b}\right)^2}\right] \quad (8)$$

where $m$ is the excessive phase shift of a diffusion transistor at the cut-off frequency and corresponds to 0.21 in radians. The input impedance will now be:

$$Z_e = r_e + \frac{r_b(1-\alpha)}{1+j\frac{f}{f_0}} \qquad (9)$$

where $$f_0 = \frac{1}{2\pi r_b C_c} \qquad (10)$$

Thus, it can be seen that the collector cut-off frequency $f_0$ must be large relative to $f_b$ when utilizing the simplified Equation 2. This requirement provides an upper limit to the value of the base resistance of the transistor in accordance with the invention. Also, it is desirable to have a low value of collector capacitance $C_c$. A small area of the collector region of the transistor provides a small $C_c$ but is limited by the $\alpha$ requirements.

The properties of the transistor between the emitter and base electrodes is shown between terminals 53 and 54 of FIG. 3 and includes in series an inductor 55 having a value L', a resistor 56 having a value $R_1'$ and a negative resistor 57 having a value $-R_2'$. When biased in a specified region of operation, the inductance L' has a relatively large value and the negative resistance $-R_2'$ has a sufficient value to effectively cancel the resistance $R_1'$.

Figure 4:
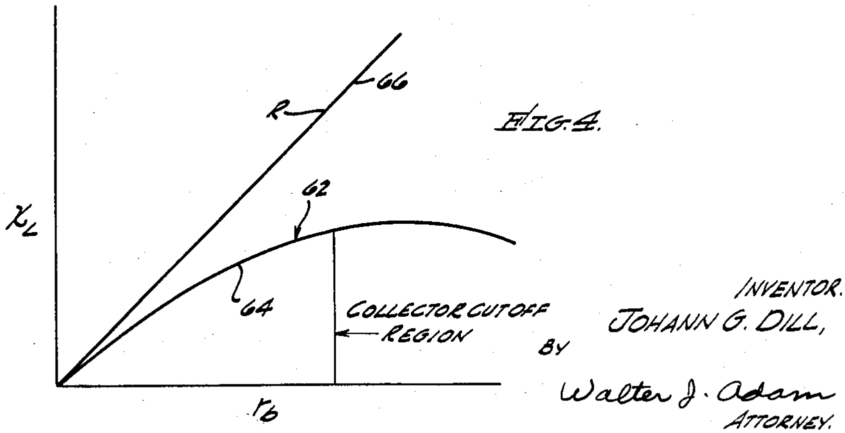
FIG. 4 is a graph of inductive reactance versus base resistance for explaining the limits of the base resistance selected in the inductive transistor device utilized in the invention.

A curve 62 of FIG. 4 shows the limits of the base resistance $r_b$ of the transistor utilized in the invention. In an essentially linear region 64 the inductance reactance $X_L$ increases substantially linearly with increasing base resistance $r_b$. However, above the linear region 64, the inductive reactance $X_L$ increases at a slow rate with increasing $r_b$ and even decreases at high values of $r_b$ because of the effect of the collector cut-off frequency $f_0$ of Equation 9. A curve 66 shows the linear increase of resistance with increasing $r_b$. Thus $r_b$ is selected to be relatively large but in the linear region 64 so as to provide a relatively large inductance with a desirable high Q.

Figure 5:
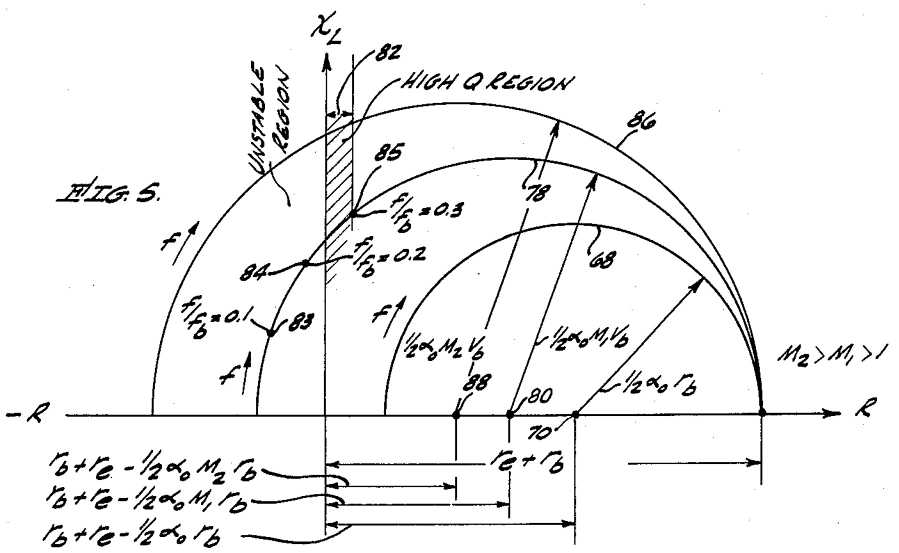
FIG. 5 is a Nyquist diagram of inductive reactance and resistance as a function of operating frequency for further explaining the inductive transistor device utilized in the invention.

A curve 68 of FIG. 5, which has the configuration of a semicircle, shows the inductive reactance $X_L$ and resistance R as a function of operating frequency $f$ of the transistor 10 as determined by Equation 5. The curve 68 has a radius equal to $\frac{1}{2}\alpha_0 r_b$ and has a center point 70 on the real axis at a point where the value of R is equal to $r_b + r_e - \frac{1}{2}\alpha_0 r_b$. It is also to be noted that the distance where the curve 68 intersects the real axis to the right of the center point 70 is at a resistance value of $r_e + r_b$. Thus, the transistor utilized in this invention has an inductive reactance varying with applied frequency $f$ along the curve 68 which has a location independent of frequency and defined by $r_b$, $r_e$ and $\alpha_0$. Therefore, it can be seen that increasing $\alpha_0$ and $r_b$ increases the radius of the curve 68 and the value of inductive reactance $X_L$. However, the curve 68 because of the relatively high resitsance $R_1'$ from the $r_e$ and $r_b$ components has a relatively low Q characteristic. It is to be noted that the $\alpha_0$ is dependent on the recombination rate and injection efficiency in the base region of the transistor.

To further explain the negative resistance properties of the inductive transistor utilized in the circuits of the invention, the $\alpha_0$ of Equation 5 is effectively increased by providing an avalanche multiplication factor so as to develop a negative resistance $-R_2'$ of FIG. 3 to effectively cancel the resistance $R_1'$. As shown by a curve 69 in FIG. 6 the transistor 10 of FIG. 1 has a negative resistance region shown with a collector voltage $V_c$ to the right or more negative than approximately −20 volts. For satisfactory operation of the high Q transistor, the emitter is based relative to the base so that only a moderate amount of avalanche multiplication is developed. As a result, the transistor develops a minimum amount of flicker noise, that is, noise resulting from imperfect avalanche breakdown in the base region. The transistor is thus maintained in a negative resistance region below a collector voltage of approximately −41 volts in the example of FIG. 6 by selecting the potential −V of the battery 28 of FIG. 1. The input impedance $Z_e$ developed when the transistor 10 is biased in the avalanche multiplication region may be expressed as:

$$Z_e = r_e + r_b - \frac{\alpha_0 r_b M f_b^2}{f_b^2 + f^2} + j\frac{\alpha_0 r_b M f_b f}{f_b^2 + f^2} \qquad (11)$$

where M is the avalanche multiplication factor having a value greater than one.

The effect of M is to cause the negative resistance term $$-\frac{\alpha_0 r_b M f_b^2}{f_b^2 + f^2}$$

to have a sufficiently large value to effectively cancel $r_e$ and $r_b$. For example, $r_e$ may be as small as 5 ohms as a result of a relatively large $I_e$ as shown in FIG. 1, $r_b$ may be 500 ohms to provide a required large inductance. Thus, a negative resistance term up to 505 ohms is necessary to compensate for the damping resistance. The effective resistance developed through the transistor 10 between terminals 12 and 22 of FIG. 1 is then zero and a theoretically infinite Q is developed. It is to be noted that the negative resistance term may have a larger value than $r_e + r_b$ and still be stable at a selected frequency because of additional resistance from elements coupled to the terminals 12 and 22. At the same time that a high Q is developed, the multiplication factor M increases the value of the inductance term of Equation 11.

The curve 68 of FIG. 5 shows the inductance and resistance characteristics of the transistor in accordance with the invention without the multiplication factor M decreasing the effective resistance, that is, when M is equal to 1. A semicircular curve 78 shows the inductive reactance and resistance variation with frequency for a value of M greater than 1. The curve 78 has a center point 80 at distance on the resistance R axis equal to $$(r_b + r_e - \tfrac{1}{2}\alpha_0 M_1 r_b)$$

and has a radius equal to $(\frac{1}{2}\alpha_0 M_1 r_b)$. Thus, the factor M both decreases the distance of the center point of the characteristic curve such as 78 along the resistance axis and increases the radius of the semicircular curve.

The curve 78 crosses the $X_L$ axis into a negative resistance −R or unstable region. The operating region at which the highest Q factor is developed is in a region indicated by an arrow 82 between zero resistance and a small positive resistance R. In order to obtain the high Q of the region indicated by the arrow 82, the operating frequency $f$ applied to the terminals 53 and 54 of FIG. 3 is selected thereat on the curve 78. It is to be noted that the distance that the curve 78 extends into the −R region is determined by the value of the multiplication factor M. It has been found that when the curve 78 falls substantially in the region indicated by the arrow 82 with the ratio $f/f_b$ from between 0.1 to 0.3, stable operation is obtained. Points 83, 84 and 85 on the curve 78 show respective $f/f_b$ ratios of 0.1, 0.2 and 0.3 which as shown in Equation 8 is the range of values for developing a desirable inductive characteristic.

Figure 6:
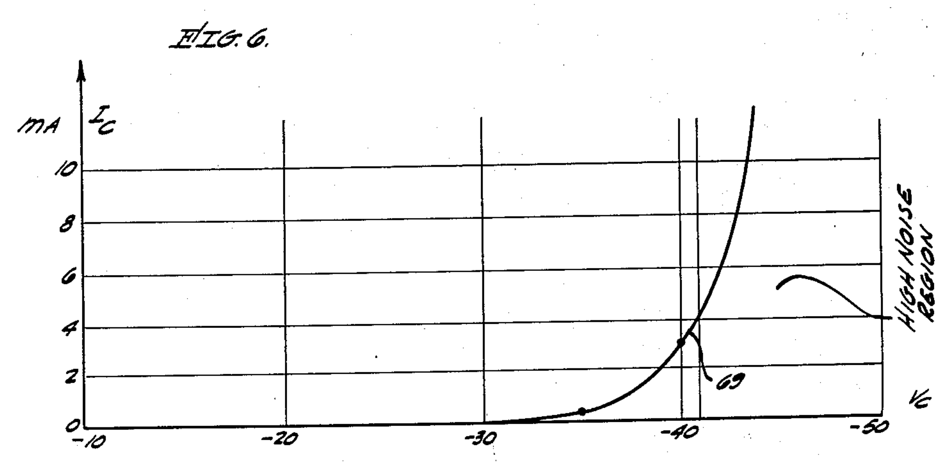
FIG. 6 is a graph of collector current versus collector voltage for explaining the operating region of the high Q inductive transistor device utilized in this invention.

A semicircular curve 86 shows the characteristics of the inductive transistor when the collector voltage $V_c$ is biased more negative as shown in FIG. 6 so that a larger multiplication factor $M_2$ is obtained. The curve 86 has a center point 88 at a distance along the resistance axis equal to $(r_b + r_e - \frac{1}{2}\alpha_0 M_2 r_b)$ and a radius equal to $$(\tfrac{1}{2}\alpha_0 M_2 r_b)$$

Thus, by increasing the avalanche multiplication factor M, the center point of the characteristic semicircular curve such as 86 is moved closer to the $X_L$ axis and the radius of the semicircular curve is increased. The result is a larger value of $X_L$ in the high Q region indicated by the arrow 82. Also, varying the value of M allows selection of a desired frequency $f$ in the high Q region. It is to be again noted that it is not desirable that the value of M be increased so that a net negative resistance is developed as shown by Equation 11 or an unstable operating condition may be present. An $f/f_b$ ratio of 0.1 to 0.3 in the region 82 has been found to be desirable for stable operation. A low resistivity material utilized in this invention for the base region but also providing a negligible combination rate of minority carriers in the base region, is preferable to minimize the reduction of the effective base width W by the depletion region. As discussed above, the effective base width W must be relatively large so that the base cut-off frequency $f_b$ is relatively small. The grounded base amplification factor $\alpha_0$ must be large, that is, close to unity. Preferably the $\alpha_0$ must be greater than 0.99. The emitter resistance $r_e$ must be selected low which results from a high emitter current $I_e$. The base resistance $r_b$ must be relatively large to develop a large inductance but below the limit established by the collector cut-off frequency. The transistor must have avalanche multiplication characteristics and an M large enough so that $\alpha_0 M$ is greater than 1.

Although the transistor has been discussed relative to a diffusion type transistor, the principles thereof are equally applicable to drift type transistors. Another desirable characteristic of the high Q transistor is that the avalanche breakdown be with a minimum amount of noise and that the transistor develop a high multiplication factor M at low values of $V_c$. The multiplication factor M may be expressed as:

$$M=\frac{1}{1-\left(\frac{V_c}{V_b}\right)^n} \qquad (12)$$

where $V_b$ is the voltage applied to the base of the transistor 10 of FIG. 1 and $n$ is a characteristic of the transistor that is selected relatively small.

As discussed above, the transistor must be maintained below the avalanche breakdown potential so that a minimum amount of noise is developed. Also, to minimize power dissipation, the collector voltage $V_c$ and the emitter current $I_e$ must not be excessively large.

Figure 7:
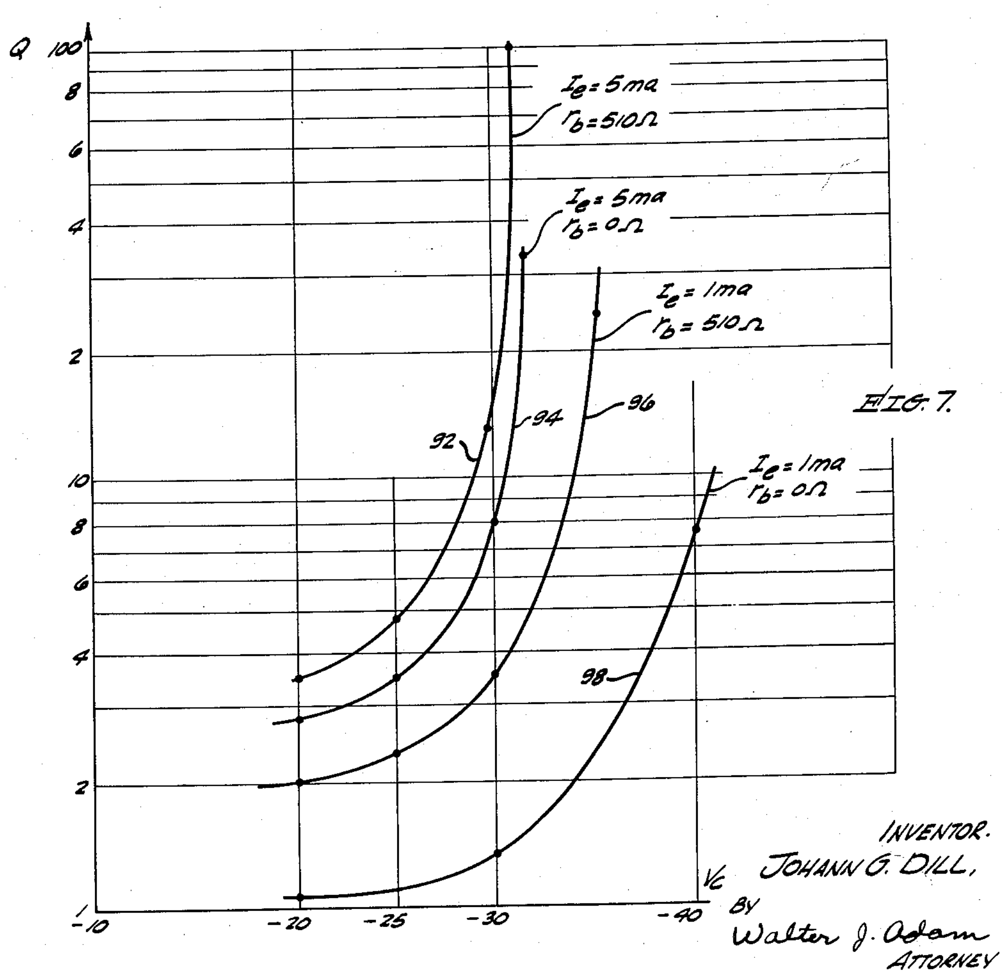
FIG. 7 is a graph of the Q factor versus collector voltage at selected base resistances and emitter currents for further explaining the properties of the inductive transistor device utilized in the invention.

Referring now to FIG. 7 the values of Q and $X_L$ may be selected by varying the parameters of the transistor utilized in this invention. A curve 92 shows the Q factor developed when one example of the transistor 10 of FIG. 1 has an $I_e$ of 5 milliamperes and a base resistance $r_b$ of 510 ohms so that a relatively large inductance $X_L$ is developed. Thus, when the transistor 10 is biased with a collector voltage between −20 and −32 volts, a large Q and a large inductance is developed. A curve 94 shows the decrease of the Q factor when the transistor has a base resistance $r_b$ equal to zero. It is to be noted that with the small $r_b$ of the curve 94, the inductance developed between the terminals 12 and 22 is relatively small. A curve 96 shows that by reducing the emitter current $I_e$ so that the emitter resistance $r_e$ increases, the Q factor is decreased and the collector of the transmitter 10 must be biased with a more negative $V_c$ to increase the value of M. When both the emitter current $I_e$ and the base resistance $r_b$ are decreased to respectively increase $r_e$ and decrease the inductive, a curve 98 shows the decrease of the Q factor. Also, the curve 98 shows that with a relatively large value of $r_e$ and small value of $r_b$ the transistor 10 must be biased close to the noise region of FIG. 6. A small value or $r_b$ decreases the negative term of Equation 11.

As an example, the inductive transistor may have a $C_c$ of 100 pico-farads, an $r_b$ of 300 ohms, a selected operating frequency $f$ of 200 kc., and a base cut-off frequency $f_b$ of 1 mc. resulting from a base width of 2 mils. Thus, the ratio of $f/f_b$ is 0.2 and $f_0$ is approximately 5 mc. so that the effect of the collector cut-off frequency does not substantially lower the value of the inductive reactance $X_L$. The multiplication factor is selected to have a value consistent with the discussion relevant to FIG. 5.

In the inductive transistor the three factors that contribute to temperature variations are the base resistance $r_b$, the base cut-off frequency $f_b$ and the emitter resistance $r_e$. Because these three properties are controlled in the transistor utilized in the invention, the bandpass amplifier circuits can be designed with a high degree of temperature stability. Also, the inductive transistor has a high degree of D.C. stability because the large base resistance $r_b$ tends to stabilize the transistor.

Figure 8:
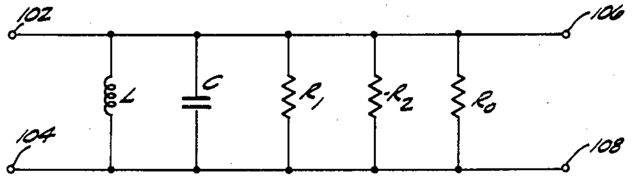
FIG. 8 is a schematic equivalent circuit diagram of the bandpass amplifier circuit of FIG. 1.

Now that the properties and characteristics of the inductive transistor utilized in FIG. 1 and in the other circuits and arrangements of the invention have been explained, reference is made to FIG. 8 which shows an equivalent circuit diagram of the bandpass amplifier of FIG. 1 coupled between input terminals 102 and 104 and output terminals 106 and 108. The parallel resonant circuit includes an inductance L developed by the transistor 10, a capacitance C developed by the diodes 40 and 42, and a resistor $R_1$ which is the sum of the emitter resistance $r_e$ and base resistance $r_b$ which as discussed above may be the $r_b'$ of the transistor 10. Also, coupled in parallel is a negative resistance $-R_2$ developed by the avalanche multiplication factor M of the transistor when biased by the battery 28 in the avalanche region as discussed relative to FIG. 6. The resistor $R_0$ also coupled in parallel arrangement includes the resistor 30 of FIG. 1 as well as any resistance coupled to the output terminals 16 and 24. It is to be again noted that a requirement of Equation 2 is that $R_L$ be substantially smaller than $r_c$ of the transistor 10 to develop the required inductance L.

In operation of the circuit of FIG. 1, a signal having a spectral band of frequencies is applied to input terminals 12 and 22. The parallel resonant circuit is tuned to a selected passband of the curve 45 by varying the potential applied to the diodes 40 and 42 to develop a desired capacitance value C. The transistor 10 has the properties as discussed above of an effective base width W so that the $f/f_b$ ratio is between 0.1 and 0.3, an $\alpha_0$ substantially close to unity, a relatively large base resistance selected below the collector cut-off region and a relatively small emitter resistance resulting from a high emitter current $I_e$. The resistor 30 is selected relatively small so that a short circuit is essentially coupled to the collector of the transistor 10 to develop the inductance L. The potential −V is selected so that the transistor 10 develops a desired $-R_2$ to overcome the loss of the resistance $R_1$. Thus, in the circuit of FIG. 1, the losses are compensated without a separate feedback arrangement and a relatively large inductance is provided to allow selection of a desired passband. By adjusting the voltage −V to compensate for the resistance losses and losses in the leads, substantial power gain is developed because the Q factor is greatly increased. Thus, the parallel resonant arrangement provides current amplification. Also, the current amplification of the circuit provides voltage amplification by selecting the load coupled to the terminals 16 and 24. Thus, the circuit of FIG. 1 amplifies signals in a selected frequency passband.

Because of the uni-directional characteristics of the transistor 10, uni-directional power flow is developed between the input terminals 12 and 22 and the output terminals 16 and 24. Thus, current is prevented from flowing into a source of signals (not shown) coupled to the input terminal 12. Bi-directional power flow is also developed when the output signals are obtained at the output terminal 48.

Figure 9:
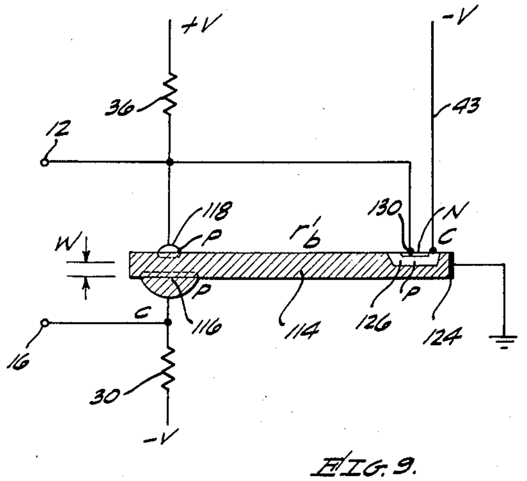
FIG. 9 is an arrangement of semiconductor elements for forming the bandpass amplifier circuit of FIG. 1 in accordance with this invention.

An arrangement useful in accordance with this invention for micro-miniaturizing the circuit of FIG. 1 is shown in FIG. 9. A block 114 which may be of n-type semiconductor material provides the base region of the transistor 10. An emitter region 118 containing p-type impurity is alloyed to one side of the block 114 at one end thereof. Alloyed to the side of the block 114 opposite to the emitter 118 is a collector region 116 which may also contain a p-type impurity. An emitter electrode is joined to the emitter region 118 and coupled to the input terminal 12 and to the resistor 36. A collector electrode is joined to the collector region 116 and coupled to the resistor 30 and to the output terminal 16.

A base ohmic contact 124 is alloyed to the block 114 at the end opposite from the emitter 118. The block 114 is elongated between the emitter 118 and the base ohmic contact 124 so that a required large base resistance $r_b'$ is developed. Other properties of the transistor 10 as discussed above are also included in the block 114 and regions 116 and 118. The effective base width W is shown between a depletion region and the collector region 118. Thus, the transistor 10 of FIG. 1 is provided. To provide the diodes 40 and 42 a region 126 of p-type impurity is diffused into the block 114 in close proximity with the base ohmic contact 124. A region 130 of n-type impurity is then diffused into the region 126. An electrode is joined to the region 130 and coupled to the emitter electrode of the emitter region 118. Another electrode is joined to the region 126 and coupled to the lead 43 and to the battery 44 of FIG. 1. Thus, the region 126 is a common p-type region responsive to the potential of the battery 44 for tuning the parallel resonant circuit. Also, the region 130 is the n-region of the diode 40, and the portion of the block 114 between the region 126 and the base ohmic contact 124 is the n or cathode region of the diode 42. Therefore, the arrangement of FIG. 9 provides a micro-miniature semiconductor arrangement of the bandpass amplifier circuit of FIG. 1.

Figure 10:
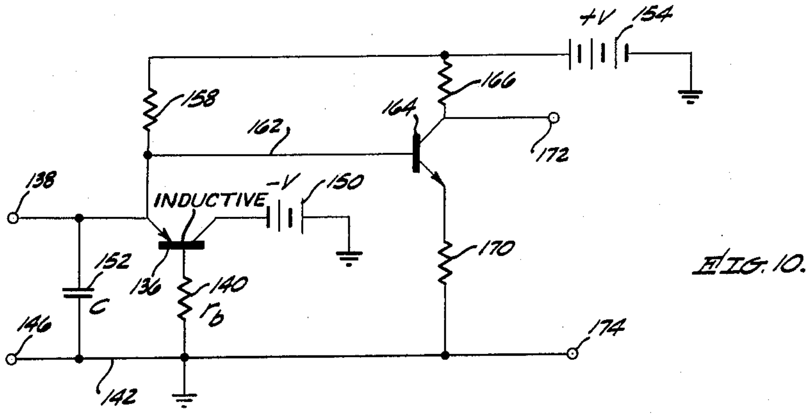
FIG. 10 is a schematic circuit diagram of another arrangement of the bandpass amplifier in accordance with the invention for providing increased amplification.

A bandpass amplifier circuit in accordance with this invention including an amplification stage is shown in FIG. 10. An inductive transistor 136 which may be of the p-n-p type having the properties discussed previously and having an emitter coupled to a first input terminal 138 is provided. The transistor has a base coupled through a base resistor 140 to a ground lead 142 which is in turn coupled to a second input terminal 146. It is to be again noted that the resistor 140 may be replaced by the intrinsic resistance $r_b'$ of the transistor 136, as previously discussed. The collector of the transistor 136 is coupled directly to a source of negative potential such as to the negative terminal of a battery 150 having a positive terminal coupled to ground. Thus, the $R_L$ of Equation 1 is essentially zero so that an $\alpha$ characteristic is developed to form a relatively large inductance. A capacitor 152 is coupled between the emitter of the transistor 136 and the ground lead 142 and for adjustable tuning may be the capacitive diodes utilized in FIG. 1. A source of potential such as a battery 154 has a negative terminal coupled to ground and a positive terminal coupled to the emitter of the transistor 136 through a resistor 158 for providing the desired emitter current to the transistor 136. The emitter current is selected to develop a relatively small emitter resistance $r_e$. A lead 162 coupled to the emitter of the transistor 136 applies the signal thereat to the base of a transistor 164 which may be of the n-p-n type and which may be a conventional transistor having a relatively large base cutoff frequency. The collector of the transistor 164 is coupled to the positive terminal of the battery 154 through a resistor 166, and the emitter is coupled to the ground lead 142 through a resistor 170 to provide additional amplification of the signal applied to the base thereof. A first output terminal 172 is coupled to the collector of the transistor 164 and a second output terminal 174 may be coupled to the ground lead 142. Thus, the bandpass amplifier circuit of FIG. 10 allows the collector of the inductive transistor 136 to be shorted for desirable avalanche operation with the transistor 164 maintaining uni-directional power flow as well as providing further amplification.

Figure 11:
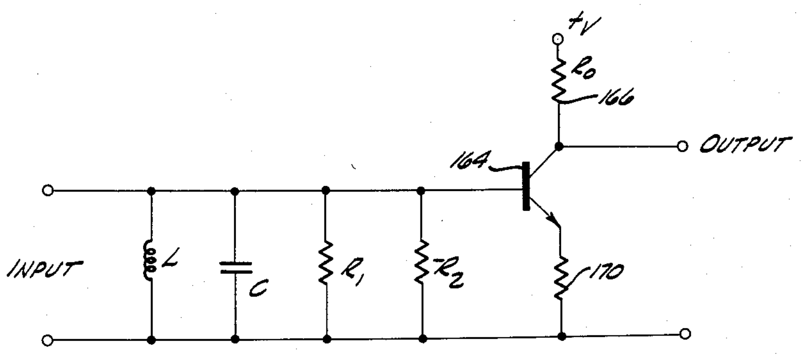
FIG. 11 is a schematic equivalent circuit diagram of the bandpass amplifier of FIG. 10.

The equivalent circuit of FIG. 11 shows the parallel coupled inductance L, capacitance C and resistance $R_1$, which may be the base resistance and emitter resistor as well as resistance in the leads. Also coupled in parallel with these elements is the negative resistance $-R_2$ developed by maintaining the transistor 136 in the avalanche region with a selected multiplication factor M. In addition to this arrangement discussed relative to FIG. 1, the resistor 170 and the base to emitter path of the transistor 164 forms a branch in parallel with the aforementioned circuit elements. Thus, the transistor 164 controls current through the load $R_0$ to apply the signals to the output terminal. Because of the transistor 164, both power gain and voltage amplification are provided between the input and output terminals of the bandpass amplifier of FIG. 10. It is to be noted that the circuit of FIG. 10 may be formed by an arrangement similar to FIG. 9 in combination with the transistor 164.

Figure 12:
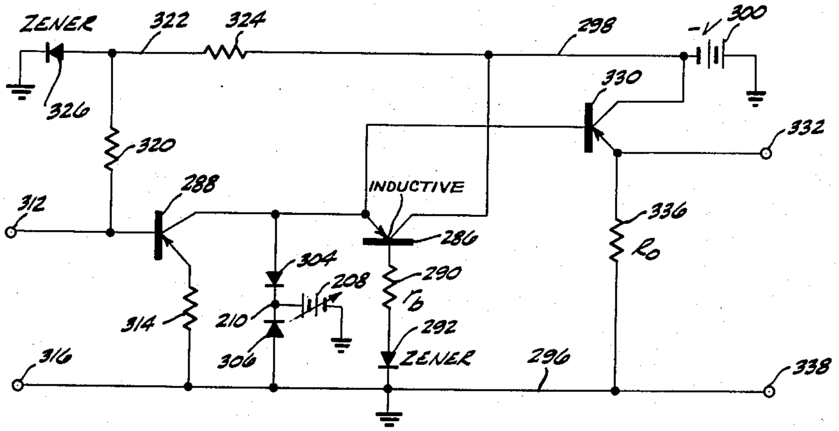
FIG. 12 is a schematic circuit diagram of still another arrangement of the bandpass amplifier in accordance with this invention providing isolating stages at the input and output sides thereof and providing a low output impedance.

Another arrangement of the amplifier in accordance with the invention utilizing a single power source and providing isolating stages at the input and the output terminals as well as providing a low output impedance is shown in FIG. 12. An inductive transistor 286 which may be of the p-n-p type has an emitter coupled to the collector of an input transistor 288 and has a base coupled through a base resistor 290 and the anode to cathode path of a zener diode 292 to a ground lead 296. The collector of the inductive transistor 286 is coupled to a lead 298 and to a source of potential such as the negative terminal of a battery 300 having a positive terminal coupled to ground. Thus, the condition of Equation 1 is satisfied by directly connecting the battery 300 to the collector of the transistor 286 for operation in a selected avalanche multiplication region. For providing the parallel capacitive element to the negative resistance resonant circuit, a capacitive diode 304 and a capacitive diode 306 have their respective anode to cathode and cathode to anode paths coupled between the emitter of the transistor 286 and the ground lead 296. The circuit is tuned by a variable source of potential such as a battery 208 having a negative terminal coupled to ground and a positive terminal coupled through a lead 210 to the cathodes of the diodes 304 and 306.

The input transistor 288 which may be of the p-n-p type and which provides isolation of the resonant circuit from an input source has a base coupled to a first input terminal 312 and an emitter coupled through a resistor 314 to the ground lead 296. A second input terminal 316 may be coupled to the ground lead 296. It is to be noted that emitter current for the inductive transistor 286 flows through the resistor 314 and the emitter to collector path of the input transistor 288. The transistor 288 which may be of a conventional transistor is biased in the amplification region by a resistor 320 coupled from the base thereof to a lead 322 which in turn is coupled at one end through a resistor 324 to the lead 298 and at the other end through the anode to cathode path of a zener diode 326 to ground. The zener diode 326 develops a constant voltage drop so that a selected base current flows through the transistor 388.

To provide isolation of the parallel resonant circuit from changes of capacitance of the output load and to provide a low output input impedance, an output transistor 330 in an emitter follower arrangement is provided. The transistor 330 which may be of the p-n-p type has a base coupled to the emitter of the inductive transistor 286 and a collector coupled to the negative terminal of the battery 300. The emitter of the output transistor 330 is coupled to a first output terminal 332 as well as hrough a signal forming resistor 336 to the ground lead 296 which in turn may be coupled to a second output terminal 338. Thus, the transistor 330 provides increased voltage amplification in the bandpass amplifier of FIG. 12.

Figures 13, 14:
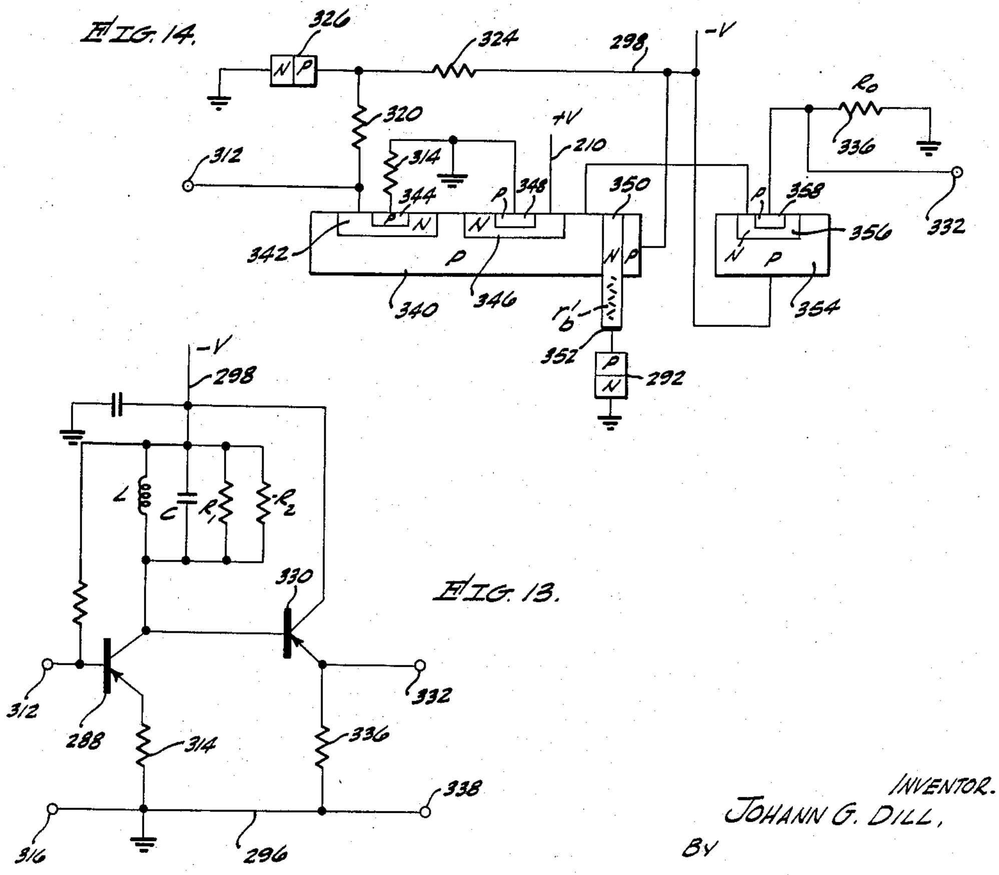
FIG. 13 is a schematic equivalent circuit diagram for explaining the circuit of FIG. 12.
FIG. 14 is an arrangement of semiconductor elements for forming the circuit of FIG. 13 in accordance with this invention.

As shown in the equivalent circuit diagram of FIG. 13, the inductive transistor 286 develops an inductance L and a resistance $R_1$, which may be the emitter resistance $r_e$ and the base resistance $r_b$ as well as other losses in the leads. Also, because of the properties of the inductive transistor 286 properly biased in an avalanche region, a negative resistance $-R_2$ is developed to overcome loses so that current and power gain are provided. The diodes 306 and 306 are tunable to develop a capacitance C which forms a desired passband at a selected center frequency. The equivalent parallel resonant circuit is coupled between the negative potential at the lead 298 and the collector of the input transistor 288 as well as beween the collector of the output transistor 330 and the base thereof. Thus, it can be seen that the bandpass amplifier circuit provides a high degree of isolation from reactive components coupled either to the input terminals 312 and 316 or to the output terminals 332 and 338. Also, as discussed above because of the negative resistance developed by the inductive transistor 286, the circuit develops substantial power gain and amplification.

A micro-mainiaturized arrangement of the bandpass amplifier circuit of FIG. 12 providing a simplified combination of semiconductor elements is shown in FIG. 14 and includes a block 340 of p-type semiconductor material. The block 340 forms the collector region of the input transistor 288. An n-type region 342 is diffused into one side of the block 340 at one end thereof and a p-type region 344 is diffused in the center of the region 342. A base electrode is joined to the region 342 and coupled to the input terminal 312 and to the resistor 320. An emitter electrode is joined to the region 344 and coupled to the resistor 314. The capacitive diodes 304 and 306 are formed by an n-type region 346 diffused into the block 340 and a p-type region 348 diffused into the region 346. An electrode is joined to the region 348 and coupled to ground and an electrode is joined to the region 346 which is the common region and coupled to the lead 210 to provide the tuning of the circuit. The anode of the diode 304 and the collector of the transistor 288 are formed by the block 340. The zener diode 326 is shown as a p-n junction as is well known in the art. The inductive transistor 286 includes an n-type region 350 formed by epitaxial growth, for example, near the end of the block 340 with the region 350 elongated to develop the required base resistance $r_b'$. A base ohmic contact 352 is alloyed to the end of the base region 350 and coupled to ground through a p-n junction providing the zener diode 292. The emitter of the inductive transistor 286 is formed by the p-type material of the block 340 which is common to the collector of the input transistor 288. The end of the block 340 to the right of the base region 350 has a collector electrode joined thereto and coupled to the lead 298. The output transistor 330 is formed from respective p-n-p regions 354, 356 and 358 by utilizing diffusion techniques. A base electrode is joined to the region 356 and coupled to an emitter electrode which is in turn coupled to the block 340. A collector electrode is joined to the region 354 and coupled to the lead 298. Also, an emitter electrode is joined to the region 358 and coupled to the output terminal 332 as well as to the load resistor 336 having a value $R_0$. Therefore, in accordance with the invention the bandpass amplifier circuit of FIG. 12 is provided in micro-miniaturized form by utilizing semiconductor materials.

Although specific transistor types have been utilized to explain the invention, it is to be recognized that opposite transistor types may be utilized within the principles of the invention.

Thus, a bandpass amplifier has been described of the parallel resonant type that utilizes an inductive transistor for providing improved operation with simplified structure. The circuit develops substantial power gain and amplification. Also, the circuit provides uni-directional power flow and in some arrangements complete isolation of the input and the output terminals. Arrangements are also shown in accordance with the invention for forming the bandpass amplifier circuits with micro-miniaturized structure.

What is claimed is:

1. A circuit for providing uni-directional power gain comprising a first transistor having emitter, base and collector regions and having emitter, base and collector electrodes joined to said respective regions, said first transistor having avalanche multiplication characteristics and being connected in a grounded base configuration, a first source of potential coupled to said emitter electrode for providing an emitter current, a second source of potential coupled to said collector electrode for biasing said first transistor to produce avalanche multiplication therein to such degree that a high Q inductive reactance is produced in the emitter-base circuit, capacitive means coupled between the emitter and base electrodes of said first transistor, an amplifying transistor having a base electrode coupled to the emitter electrode of said first transistor and having a load current path coupled between said first source of potential and ground, an input terminal coupled to the emitter electrode of said first transistor, and an output terminal coupled to said load current path.

2. A circuit responsive to signals for providing uni-directional power gain between an input terminal and an output terminal comprising a first transistor having emitter, collector and base regions and having emitter, collector and base electrodes joined to said respective regions, said emitter electrode being coupled to said input terminal and said base electrode being coupled to a conductive element, a source of emitter current coupled to said emitter electrode, a source of biasing potential coupled to said collector electrode for biasing said first transistor to produce avalanche multiplication therein such that the resultant negative resistance in the emitter-base circuit is substantially equal in magnitude to the positive resistance in said emitter-base circuit measured between said input terminal and said conductive element, variable capacitive means coupled between said emitter electrode and said conductive element, and a second transistor having a base coupled to the emitter of said first transistor, an emitter coupled to said conductive element, and a collector coupled to said source of emitter current and to said output terminal.

3. A circuit for providing uni-directional power gain between an input terminal and an output terminal over a passband having a selected center frequency comprising an inductive transistor having emitter, collector and base regions and having emitter, collector and base electrodes coupled to said respective regions, the emitter electrode of said inductive transistor being coupled to said input terminal and the base electrode of said inductive transistor being coupled to a conductive element, said transistor having a grounded base current amplification factor substantially close to unity and having avalanche multiplication characteristics, a source of emitter current coupled to the emitter electrode of said inductive transistor, a source of potential coupled to the collector electrode of said inductive transistor for biasing said inductive transistor to produce avalanche multiplication therein such that the resultant negative resistance in the emitter-base circuit is substantially equal in magnitude to the positive resistance in said emitter-base circuit measured between said input terminal and said conductive element whereby a high Q inductive reactance is produced in said emitter-base circuit, capacitive means coupled between said emitter electrode and said conductive element for providing a capacitive reactance resonant with said inductive reactance at said selected center frequency, and an amplifying transistor having a base electrode coupled to the emitter electrode of said inductive transistor, a collector electrode coupled to said source of emitter current and to said output terminal, and an emitter electrode coupled to said conductive element.

4. A circuit for providing uni-directional power gain between first and second input terminals and first and second output terminals within a passband having a selected center frequency comprising a first transistor having emitter, collector and base regions and having emitter, collector and base electrodes joined to said respective regions, said emitter electrode of said first transistor being coupled to said first input terminal, said base electrode of said first transistor being coupled to said second input terminal and to said second output terminal, a first source of potential resistively coupled to said emitter electrode for providing an emitter current, a second source of potential coupled to said collector electrode for biasing said first transistor to produce avalanche multiplication therein such that the resultant negative resistance in the emitter-base circuit is substantially equal in magnitude to the positive resistance in said emitter-base circuit measured between said first and second input terminals whereby a high Q inductive reactance is produced in said emitter-base circuit, capacitive means coupled between said first and second input terminals for providing a capacitive reactance resonant with said inductive reactance at said center frequency, a second transistor having an emitter electrode coupled to said second output terminal, a base electrode coupled to the emitter electrode of said first transistor, and a collector electrode coupled to said first output terminal, said second transistor having a base cut-off frequency substantially greater than said selected center frequency, and a load resistor coupled between the collector electrode of said second transistor and said first source of potential.

5. A circuit for providing signal amplification between first and second input terminals and first and second output terminals comprising a first transistor having emitter, collector and base regions and having emitter, collector and base electrodes coupled to said respective regions, the base electrode of said first transistor being coupled to said first input terminal and to said first output terminal, a second transistor having an emitter electrode coupled to said first input terminal, a collector electrode coupled to the emitter electrode of said first transistor, and a base electrode coupled to said second input terminal, a source of biasing potential coupled to the base electrode of said second transistor and to the collector electrode of said first transistor to produce avalanche multiplication in said first transistor such that the resultant negative resistance in the emitter-base circuit thereof is substantially equal in magnitude to the positive resistance in said emitter-base circuit measured between the emitter electrode of said first transistor and said first input terminal, capacitive means coupled between said emitter electrode of said first transistor and said first input terminal, a third transistor having a base electrode coupled to the emitter electrode of said first transistor, a collector electrode coupled to said source of biasing potential, and an emitter electrode coupled to said second output terminal, and a resistor coupled between the emitter electrode of said third transistor and said first output terminal.

References Cited in the file of this patent

UNITED STATES PATENTS

| | | |
|---|---|---|
| 2,986,657 | Kagan | May 30, 1961 |
| 3,001,146 | Kaol | Sept. 19, 1961 |

UNITED STATES PATENT OFFICE

CERTIFICATE OF CORRECTION

Patent No. 3,119,075 January 21, 1964

Johann G. Dill

It is hereby certified that error appears in the above numbered patent requiring correction and that the said Letters Patent should read as corrected below.

Column 5, line 69, for "based" read -- biased --; column 7, line 67, for "or" read -- of --; column 10, line 51, strike out "of"; line 58, for "388" read -- 288 --; column 11, line 5, for "loses" read -- losses --; line 6, for "306", first occurrence, read -- 304 --.

Signed and sealed this 30th day of June 1964.

(SEAL)
Attest:

RNEST W. SWIDER
Attesting Officer

EDWARD J. BRENNER
Commissioner of Patents